United States Patent
Wambsganss (10) Patent No.: US 11,670,448 B2
(45) Date of Patent: Jun. 6, 2023

(54) SYSTEM OF TERMINATION OF HIGH POWER TRANSFORMERS FOR REDUCED AC TERMINATION LOSS AT HIGH FREQUENCY

(71) Applicant: Astronics Advanced Electronic Systems Corp., Kirkland, WA (US)

(72) Inventor: Warren J. Wambsganss, Snoqualmie, WA (US)

(73) Assignee: Astronics Advanced Electronic Systems Corp., Kirkland, WA (US)

( * ) Notice: Subject to any disclaimer, the term of this patent is extended or adjusted under 35 U.S.C. 154(b) by 146 days.

(21) Appl. No.: 15/972,511

(22) Filed: May 7, 2018

(65) Prior Publication Data
US 2019/0341186 A1    Nov. 7, 2019

(51) Int. Cl.
*H01F 27/28*    (2006.01)
*H01F 30/04*    (2006.01)
(Continued)

(52) U.S. Cl.
CPC ............ *H01F 30/04* (2013.01); *H01F 5/003* (2013.01); *H01F 27/2847* (2013.01); *H01F 27/38* (2013.01); *H05K 1/16* (2013.01)

(58) Field of Classification Search
CPC .... H01F 27/29; H01F 27/292; H01F 27/2847; H01F 27/2852; H01F 30/04; H01F 27/38; H01F 2007/062; H01F 2027/295
(Continued)

(56) References Cited

U.S. PATENT DOCUMENTS 2,246,167 A * 6/1941 D'Entremont .......... H01F 38/30
                                                          336/182
2,474,395 A * 6/1949 Early ...................... H01F 19/00
                                                          336/107
(Continued)

FOREIGN PATENT DOCUMENTS

CN    203706831 U    7/2014
CN    204011288 U  * 12/2014
(Continued)

OTHER PUBLICATIONS

WIPO, PCT/US2019/029704; International Search Report; dated Jul. 10, 2019.
(Continued)

*Primary Examiner* — Mang Tin Bik Lian
*Assistant Examiner* — Joselito S. Baisa
(74) *Attorney, Agent, or Firm* — Wiggin and Dana LLP (57) ABSTRACT

A planar transformer includes a magnetic core having an internal opening. A plurality of high current capacity windings are disposed within the internal opening. These high current capacity windings have a length, a width and a thickness. Each winding is formed as an open loop having adjacent first and second end portions. There is at least one primary winding and one secondary winding. The primary winding and/or secondary winding may be high current capacity windings. A first terminal lead is electrically interconnected to multiple adjacent first end portions and a second terminal lead is electrically interconnected to multiple second end portions. Both the first terminal lead and said second terminal lead have a length, a width and a thickness measured with the thickness being less than either the terminal lead length or the terminal lead width.

20 Claims, 8 Drawing Sheets

(51) Int. Cl.
   *H01F 27/38* (2006.01)
   *H01F 5/00* (2006.01)
   *H05K 1/16* (2006.01)

(58) Field of Classification Search
   USPC .................................................. 336/232
   See application file for complete search history.

(56) References Cited

U.S. PATENT DOCUMENTS

| | | | | |
|---|---|---|---|---|
| 2,535,554 A * | 12/1950 | Thurston | | H01F 27/346 |
| | | | | 336/183 |
| 3,465,272 A * | 9/1969 | Bach | | H01F 27/40 |
| | | | | 336/12 |
| 3,916,088 A * | 10/1975 | Keller | | H01B 17/305 |
| | | | | 174/152 R |
| 4,513,273 A * | 4/1985 | Friedl | | H01F 38/30 |
| | | | | 324/127 |
| 4,835,463 A * | 5/1989 | Baran | | G01R 1/203 |
| | | | | 324/123 R |
| 4,873,757 A * | 10/1989 | Williams | | H01F 17/0013 |
| | | | | 29/602.1 |
| 5,010,314 A | 4/1991 | Estov | | |
| 5,034,717 A * | 7/1991 | Shinkai | | H01F 27/2847 |
| | | | | 336/223 |
| 5,345,670 A * | 9/1994 | Pitzele | | H01F 17/0006 |
| | | | | 264/272.19 |
| 5,559,487 A * | 9/1996 | Butcher | | H01F 27/324 |
| | | | | 336/178 |
| 6,046,662 A | 4/2000 | Schroter et al. | | |
| 6,073,339 A | 6/2000 | Levin | | |
| 6,114,939 A | 9/2000 | Wittenbreder | | |
| 6,160,467 A * | 12/2000 | Teimorzadeh | | H01F 27/2852 |
| | | | | 336/180 |
| 6,335,671 B1 | 1/2002 | Roessler et al. | | |
| 6,774,755 B2 * | 8/2004 | Nakata | | H01F 27/29 |
| | | | | 336/200 |
| 6,882,260 B2 | 4/2005 | Katzir et al. | | |
| 7,091,817 B2 * | 8/2006 | Peck | | H01F 27/2847 |
| | | | | 336/198 |
| 7,248,139 B1 * | 7/2007 | Podlisk | | H01F 27/2847 |
| | | | | 336/232 |
| 7,277,001 B2 * | 10/2007 | Mizushima | | H01F 17/04 |
| | | | | 336/192 |
| 7,460,002 B2 | 12/2008 | Estov | | |
| 7,567,164 B2 * | 7/2009 | Chin | | H01F 30/06 |
| | | | | 336/198 |
| 8,013,709 B2 | 9/2011 | Tsai et al. | | |
| 8,471,665 B2 * | 6/2013 | Urano | | H01F 27/292 |
| | | | | 336/212 |
| 8,841,984 B1 | 9/2014 | Wambsganss | | |
| 8,896,406 B2 * | 11/2014 | Yamamoto | | H01F 5/00 |
| | | | | 336/200 |
| 9,105,390 B2 * | 8/2015 | Yang | | H01F 27/306 |
| 9,129,734 B2 * | 9/2015 | Wei | | H01F 27/292 |
| 9,142,345 B2 * | 9/2015 | Chen | | H01F 27/2847 |
| 9,305,696 B2 * | 4/2016 | Kuo | | H01F 27/2847 |
| 9,378,885 B2 | 6/2016 | Hongzhong et al. | | |
| 10,062,496 B2 * | 8/2018 | Yalamanchili | | H01F 27/306 |
| 2005/0212640 A1 | 9/2005 | Chiang et al. | | |
| 2006/0082431 A1 * | 4/2006 | Estrov | | H01F 27/292 |
| | | | | 336/192 |
| 2008/0122569 A1 * | 5/2008 | Ye | | H01F 27/40 |
| | | | | 336/223 |
| 2009/0079528 A1 | 3/2009 | Shabany et al. | | |
| 2009/0189726 A1 * | 7/2009 | Godbey | | H01F 27/29 |
| | | | | 336/192 |
| 2009/0302986 A1 * | 12/2009 | Bedea | | H01F 27/34 |
| | | | | 336/55 |
| 2009/0315660 A1 * | 12/2009 | Oki | | H01F 27/292 |
| | | | | 29/605 |
| 2010/0265029 A1 | 10/2010 | Xiong et al. | | |
| 2010/0271161 A1 * | 10/2010 | Yan | | H01F 1/26 |
| | | | | 336/83 |
| 2011/0148559 A1 * | 6/2011 | Ikriannikov | | H01F 27/292 |
| | | | | 336/192 |
| 2013/0106557 A1 * | 5/2013 | Kuang | | H01F 27/40 |
| | | | | 336/220 |
| 2013/0194061 A1 | 8/2013 | Wei et al. | | |
| 2015/0221431 A1 * | 8/2015 | Wu Li | | H01F 27/2871 |
| | | | | 336/192 |
| 2017/0032888 A1 * | 2/2017 | Park | | H01F 27/2804 |
| 2017/0117090 A1 * | 4/2017 | Liu | | H01F 27/2866 |
| 2017/0366093 A1 | 12/2017 | Wambsganss | | |

FOREIGN PATENT DOCUMENTS

| | | |
|---|---|---|
| EP | 2523198 A1 | 11/2012 |
| JP | 2013012317 A * | 1/2013 |
| JP | 2013218882 A * | 10/2013 |

OTHER PUBLICATIONS

European Patent Office; EP 19799175.5; Extended European Search Report; dated Jan. 7, 2022.

* cited by examiner

FIG. 1

Prior Art

SYSTEM OF TERMINATION OF HIGH POWER TRANSFORMERS FOR REDUCED AC TERMINATION LOSS AT HIGH FREQUENCY

BACKGROUND

Linkage between cockpit controls and moving parts on an aircraft, such as the rudder or landing gear, was previously by hydraulic or mechanical interconnection. There is a desire to make the aircraft lighter weight leading to higher efficiency and better fuel economy. One approach toward achieving these goals is to make the aircraft linkages electric, rather than hydraulic or mechanical. Electrification of the linkages requires highly efficient, light weight power conversion, including AC/DC power conversion and DC/DC power conversion.

Switch frequencies in switch mode power converters continue to increase as semiconductor technology improves. A high switch frequency enables power converters to be reduced in size, weight and cost, but typically comes at the penalty of loss of efficiency. Improved semiconductor devices and control technologies, which allow switching frequencies to be increased without loss of efficiency, are now widely utilized. However, the power transformer is often times still the limiting factor in how small and efficient a power converter can become, even with an increased switch frequency. AC losses in the windings and termination losses dominate the power dissipation in a transformer and its interfaces with high switching frequencies, particularly when high AC currents are present. Termination losses are caused by current concentrations at the transformer interfaces due to the proximity effect in terminals, bus bars, or circuit board traces. When high currents are present, termination losses can even exceed the power dissipation of the transformer.

Planar transformers are commonly used with high switch frequencies because of their improved high frequency performance over traditional, round wire transformer construction. Planar transformer windings are constructed with flat conductors, typically with traces on printed wiring boards, or from sheet metal that has been stamped or etched into the shape of a winding. U.S. Pat. No. 5,559,487, "Winding Construction for Use in Planar Magnetic Devices," by Butcher et al., discloses a planar transformer constructed from a series of metal stampings to form windings which are separated by thin insulators. Alternatively, as disclosed in U.S. Pat. No. 6,073,339, "Method of Making Low Profile Pin-Less Planar Magnetic Devices," by Levin, the conductive windings may be formed as conductive, typically copper, circuit traces on one or multiple dielectric substrates.

These flat conductors are less influenced than round wire transformers by skin and proximity effects because the thickness of the windings is often times less than the skin depth at the operating frequency. However, planar transformers are difficult to connect to external transistors and rectifiers in a way that does not cause significant dissipation due to termination loss. While the flat windings in a planar transformer are an ideal geometry that can be optimized for low loss, the terminals that provide external connection are often times less than ideal. Applicant's disclosure below improves on existing terminal arrangements and reduces planar transformer termination loss.

Figure 3:
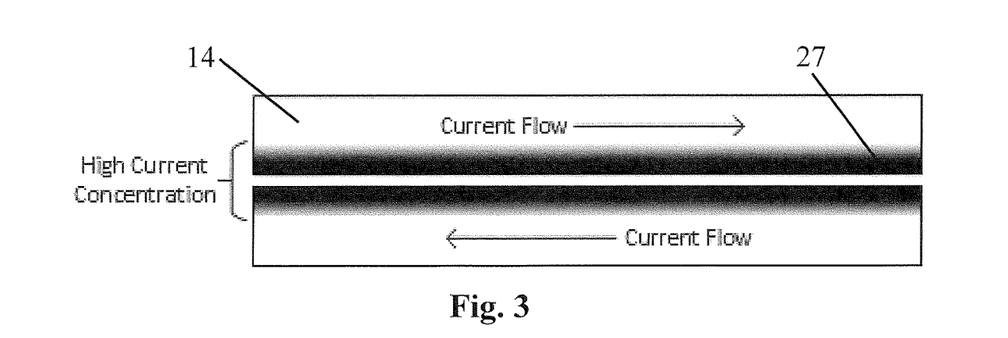
FIG. 3 illustrates the proximity effects causing current to crowd near the edges of a conductor when AC current is flowing in opposite directions.

U.S. Pat. No. 7,460,002, "Terminal System for Planar Magnetics Assembly," by Estrov discloses that when interconnecting high current planar transformer windings, the AC impedance must be evenly balanced between all parallel windings. If the AC impedance is not balanced, significant current asymmetry or circulating currents occur between parallel connected windings, which results in increased levels of dissipation and loss of power conversion efficiency. While an improvement over the prior art, the approach put forward by Estrov neglects significant current crowding and increased AC resistance associated with the proximity effect in the terminals. As illustrated in FIG. 3 of this disclosure, the proximity effects cause current to crowd near the edges of a conductor when AC current is flowing in opposite directions.

The regions of high current density near the edges of the parallel terminals and the interconnecting bus bars are regions of significantly elevated power loss. Since the terminal arrangement disclosed in U.S. Pat. No. 7,460,002 orients the planar transformer terminals and interconnecting busbars edge-to-edge, only a very small percentage of the material cross section is utilized for current flow. For low switching frequencies, this effect is less pronounced. However, for high switching frequencies and high power levels, the associated losses can grow to be more than the internal transformer winding losses.

U.S. Pat. Nos. 5,559,487, 6,073,339 and 7,460,002 are incorporated by reference herein in their entireties.

There remains a need for a planar transformer having terminations and interconnects that improve the performance, manufacturability and size/weight of the planar transformer as compared to those presently utilized. Because of this, new, high frequency transformer construction and termination techniques must be developed for efficient high frequency operation.

BRIEF SUMMARY

A planar transformer includes a magnetic core having an internal opening. A plurality of high current capacity windings are disposed within the internal opening. These high current capacity windings have a length, a width and a thickness. Each winding is formed as an open loop having adjacent first and second end portions. There is at least one primary winding and one secondary winding. The primary winding and/or the secondary winding may be high current capacity windings. A first terminal lead is electrically interconnected to multiple adjacent first end portions and a second terminal lead is electrically interconnected to multiple second end portions. Both the first terminal lead and said second terminal lead have a length, a width and a thickness measured with the thickness being less than either the terminal lead length or the terminal lead width.

DETAILED DESCRIPTION

Figure 1:
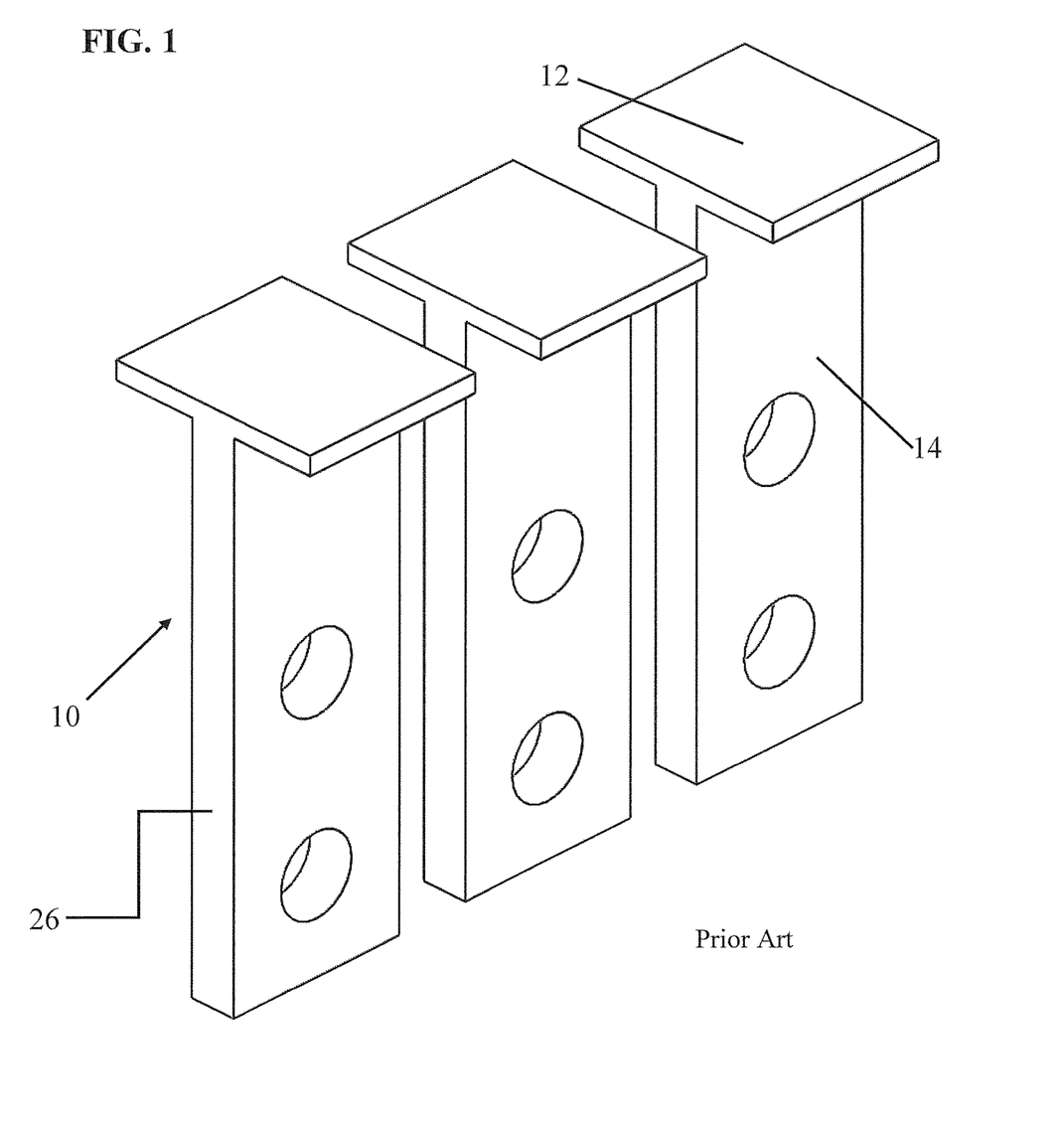
FIG. 1 illustrates in 3D perspective terminal leads for a planar transformer as known from the prior art.
Figure 2:
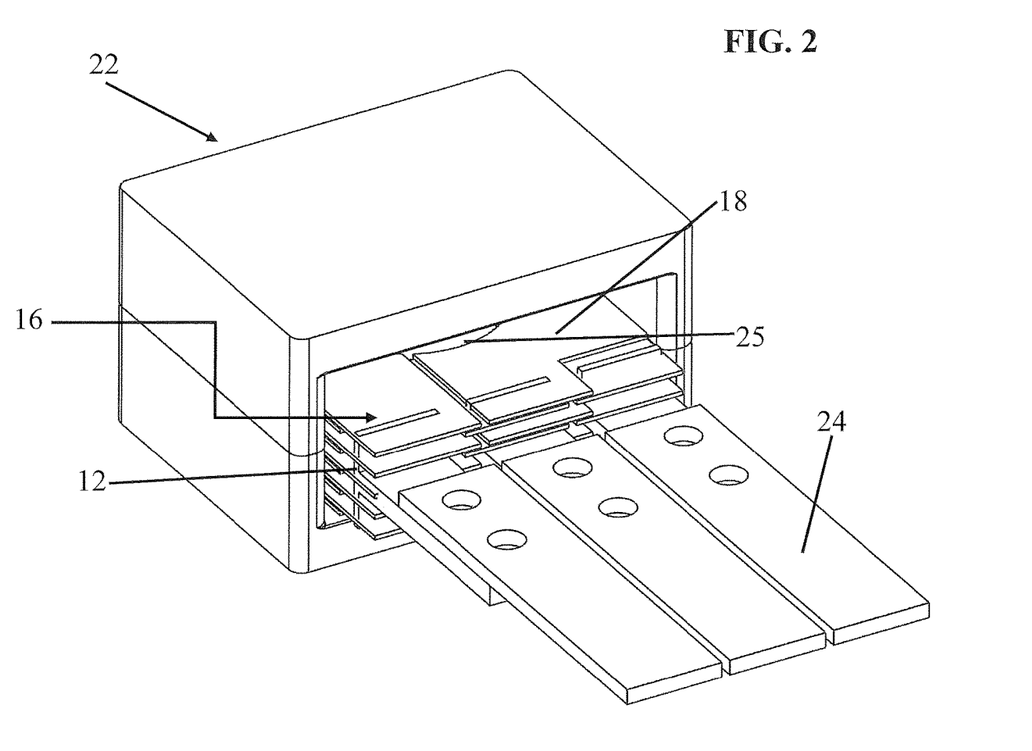
FIG. 2 illustrates in 3D perspective the terminal leads of FIG. 1 electrically interconnected to windings of the planar transformer as known from the prior art.

FIG. 1 illustrates in 3D perspective terminal leads 10 for a planar transformer as known from the prior art. The terminal leads 10 are generally T-shaped with a first leg 12 and a second leg 14 off-set by 90°. Referencing FIG. 2, the first leg 12 is inserted into apertures 16 formed in the windings 18. The windings extend into an internal opening formed within a magnetic core 22. The magnetic core 22 is formed from a magnet material such as a ferrite optimized for power conversion and typically includes a central leg 25 extending through a centrally disposed aperture in the windings 18. Typically, this leg has a cylindrical or rectangular cross-section. Bus bars 24 electrically interconnect the terminal leads with a bolted connection.

Referring back to FIG. 1, the second leg 14 has a generally rectangular cross-section with relatively small surface area faces 26 adjacent one another. The regions of high current density near the edges of the parallel terminals and the interconnecting bus bars are regions of significantly elevated power loss. This proximity effect is illustrated in FIG. 3. The proximity effect causes current to crowd near the edges of a conductor when AC current is flowing in opposite directions. The proximity effect is most pronounced at high switching frequencies, nominally when the switching frequency exceeds 40 kHz and at high power levels, nominally, a power level in excess of 500 Watts. Referencing FIG. 3, with a current level of 100 Amps and a switch frequency of 100 kHz, approximately 70 percent of the current flow is concentrated along the edge 27 of the second leg 14.

Figure 4:
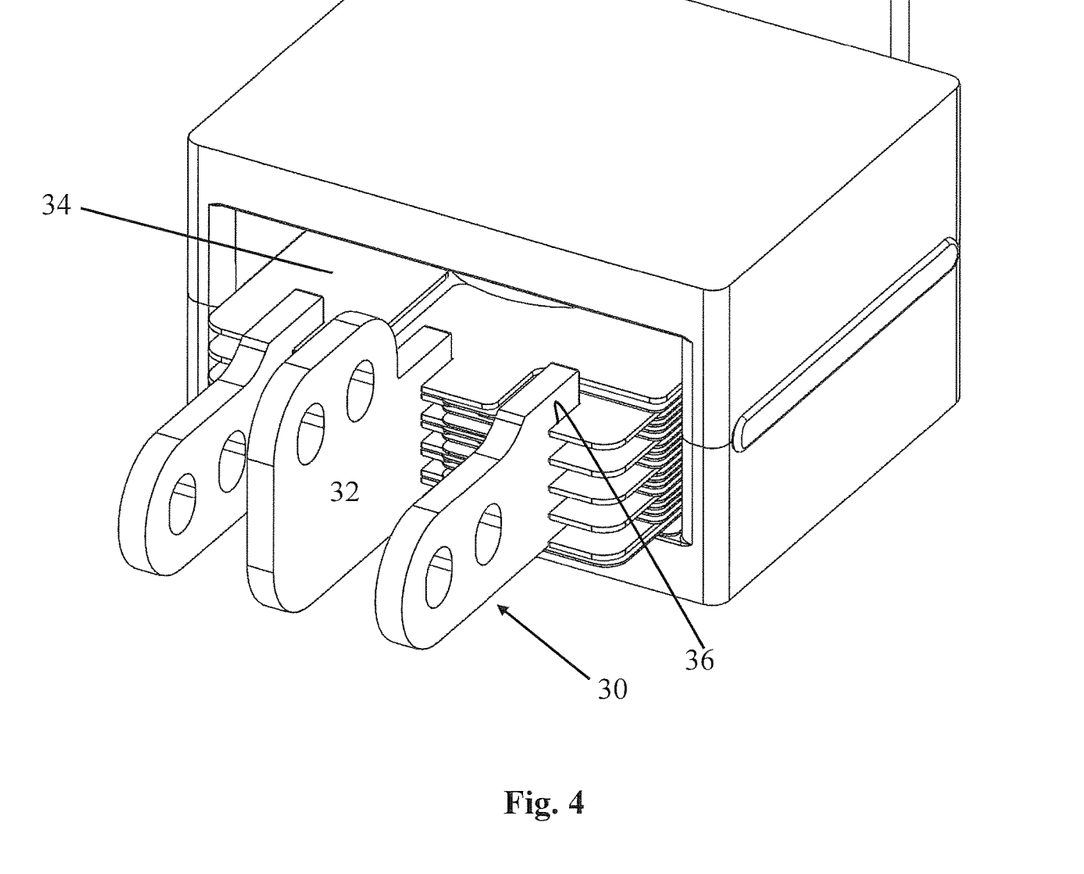
FIG. 4 illustrates in 3D perspective terminal leads in accordance with a first embodiment disclosed herein.
Figure 5:
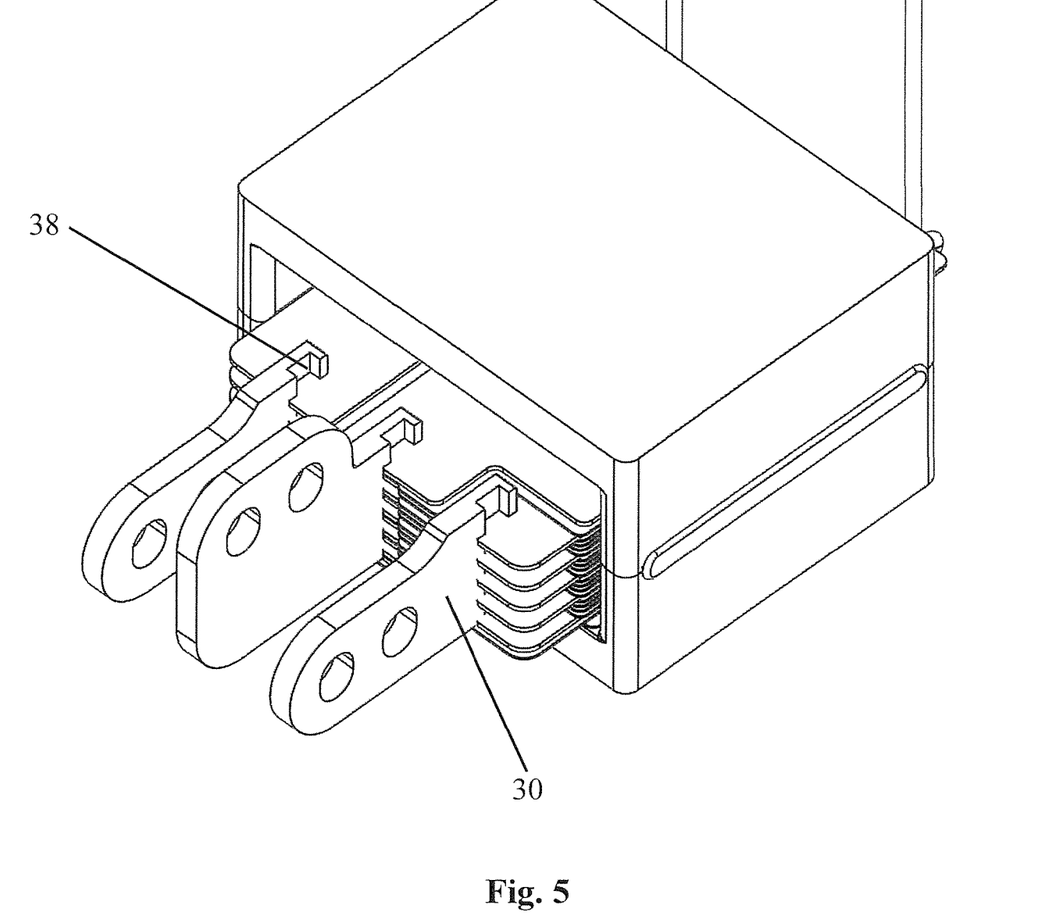
FIG. 5 illustrates in 3D perspective the terminal leads of FIG. 4 with addition of a retention feature.

FIG. 4 illustrates in 3D perspective terminal leads in accordance with a first embodiment of the disclosure. The terminal leads 30 are formed from an electrically conductive material, such as copper or a copper-base alloy. Instead of horizontally oriented terminals, the terminal leads 30 are vertically oriented. The vertically oriented terminal leads 30 have relatively large surface area faces 32 adjacent one another. The vertically oriented terminal leads 30 may be spaced close together or far apart, as dictated by the mechanical and performance requirements. Typically, for a high switch frequency, high power level application, the spacing between vertically oriented terminal leads is between 0.25 inch and 6 inches. High current capacity windings 34, implemented as metal stampings, etchings or printed wiring boards, contain a notch 36 or groove to accept the vertically oriented terminal leads 30. Alternatively, a notch may be formed in the vertically oriented terminal leads 30 to accept an edge of the high current capacity windings. The vertically oriented terminal leads 30 may be soldered, brazed, pressed, or otherwise electrically connected to the planar transformer windings. The notch 36 or groove contained in the windings may be a simple rectangular geometry, or a more complex geometry, such as a slotted retention feature 38 as shown in FIG. 5 to provide improved retention of the vertically oriented terminal leads 30.

Figure 6:
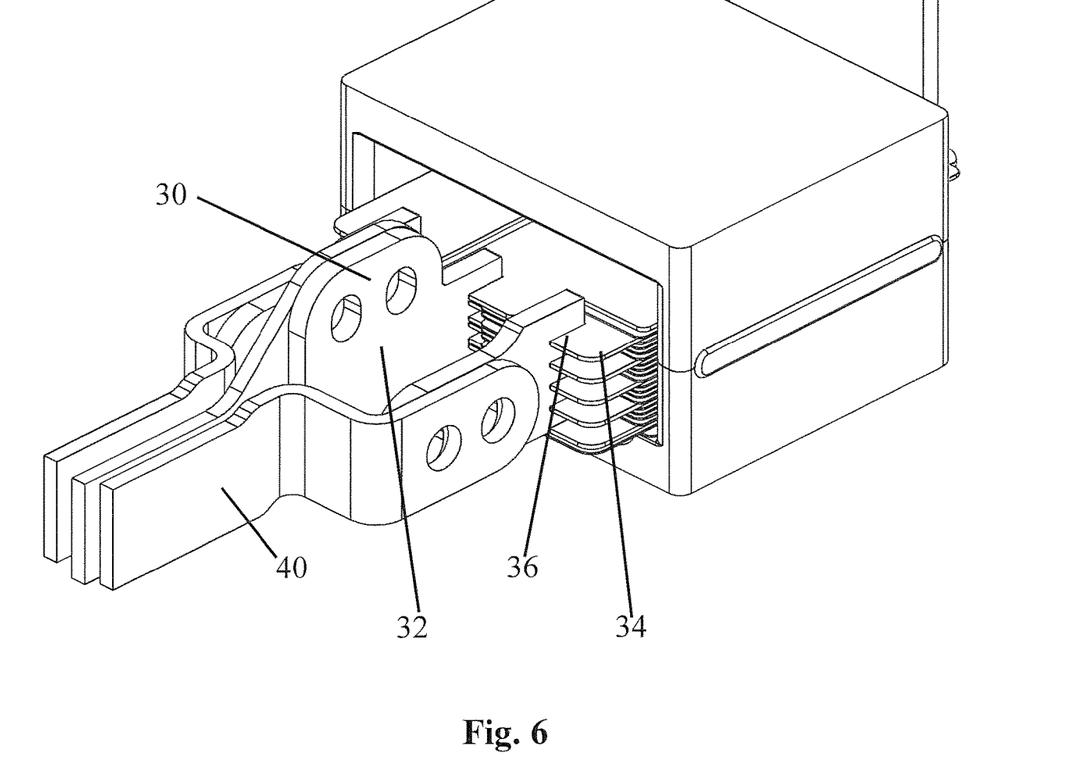
FIG. 6 illustrates in 3D perspective the terminal leads of FIG. 4 with an addition of bus bars.
Figure 7:
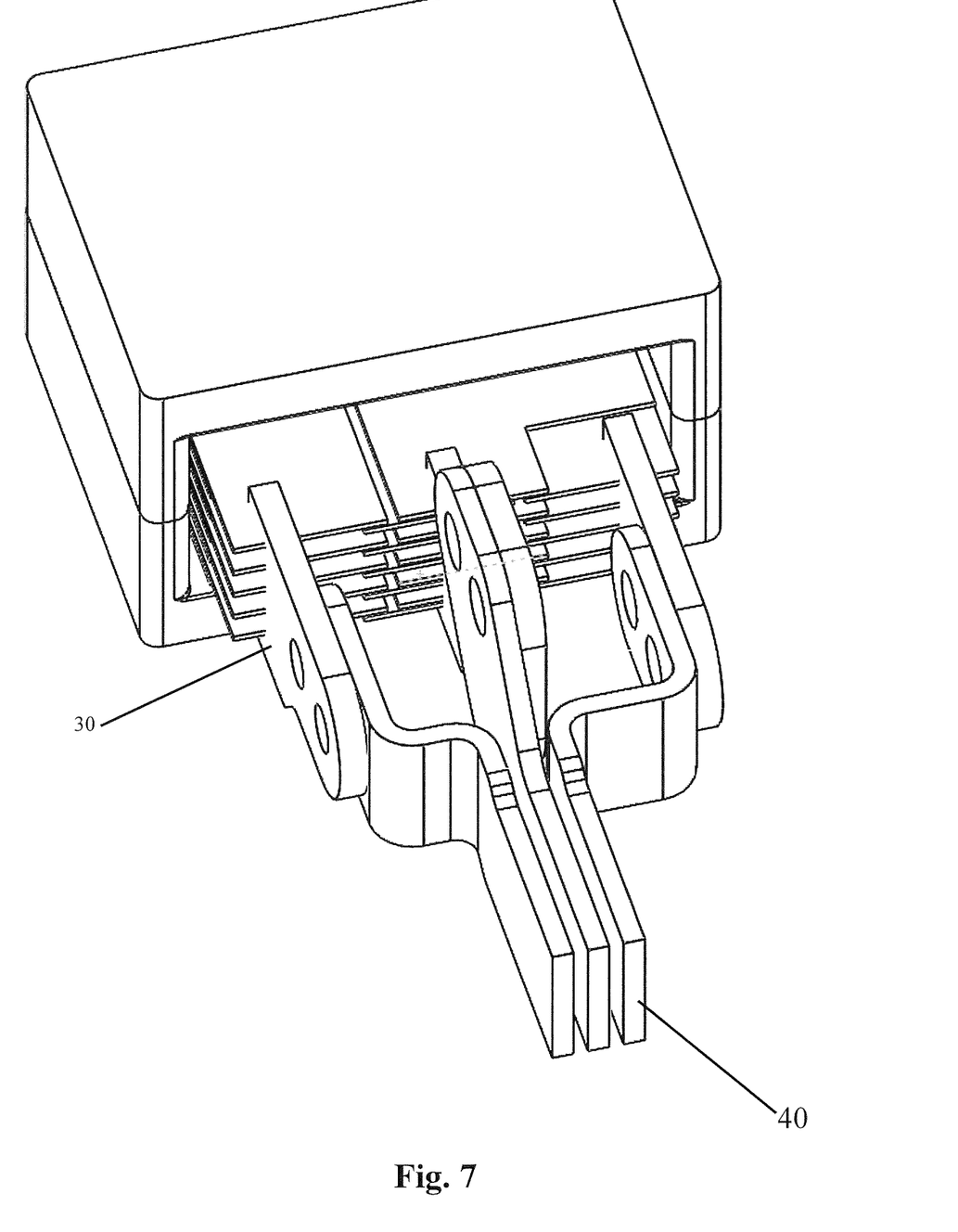
FIG. 7 illustrates in another 3D perspective the terminal leads of FIG. 4 with an addition of bus bars.

This terminal arrangement has multiple beneficial qualities. Proximity effects still have an influence on current distribution within the terminals, but now the flat surface area faces 32 of the terminal leads 30 and mating bus bars 40 are facing each other as shown in FIGS. 6 and 7, allowing a higher fraction of the bus bar 40 cross sectional area to be utilized to carry current. Since the terminal leads 30 fit into a slot defined by notches 36, the transformer windings 34 are allowed to move vertically during assembly, providing allowance for manufacturing variability. With the terminal connections centered on the stack of paralleled transformer windings 34, the AC impedance is balanced, facilitating even current flow between windings. The same terminals may be used in multiple different designs, allowing modularity of design and a common building block approach.

EXAMPLE

Figure 8:
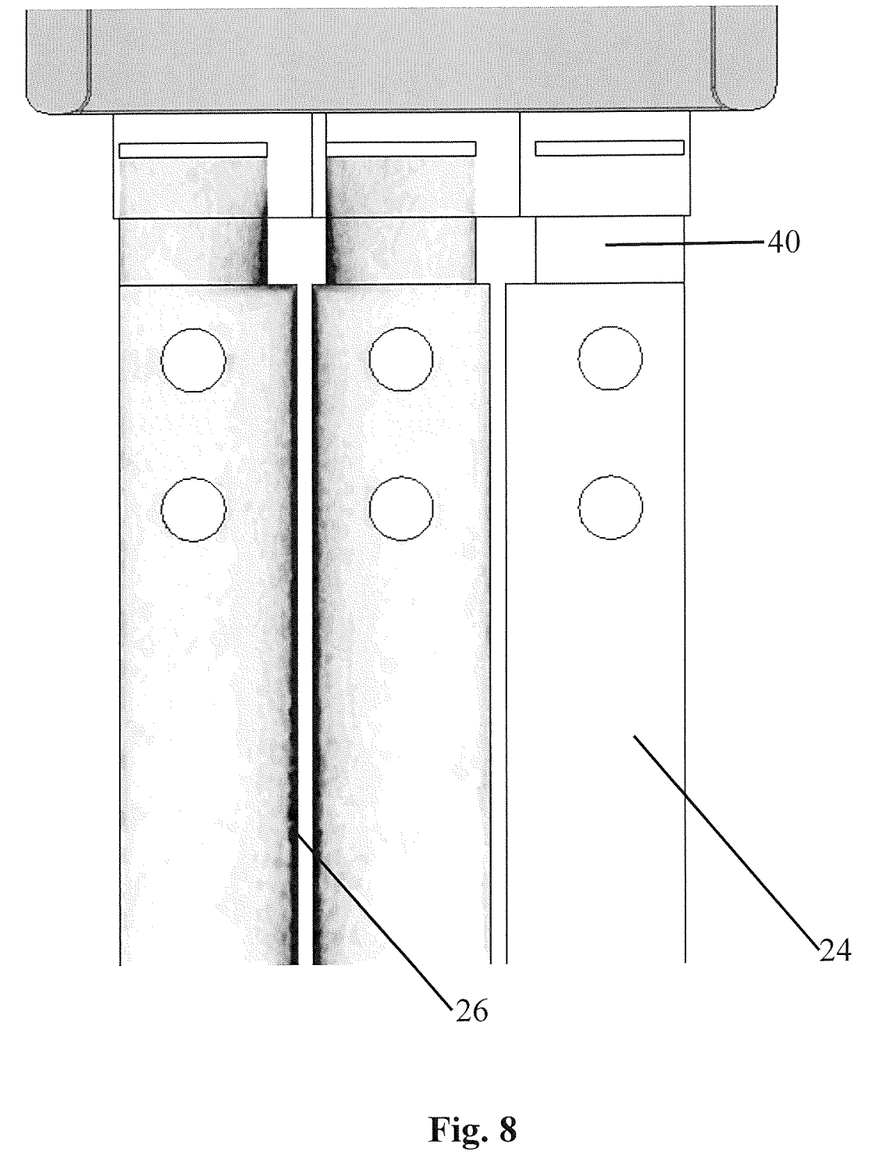
FIG. 8 illustrates terminal and bus bar current density for a terminal lead known from the prior art.
Figure 9:
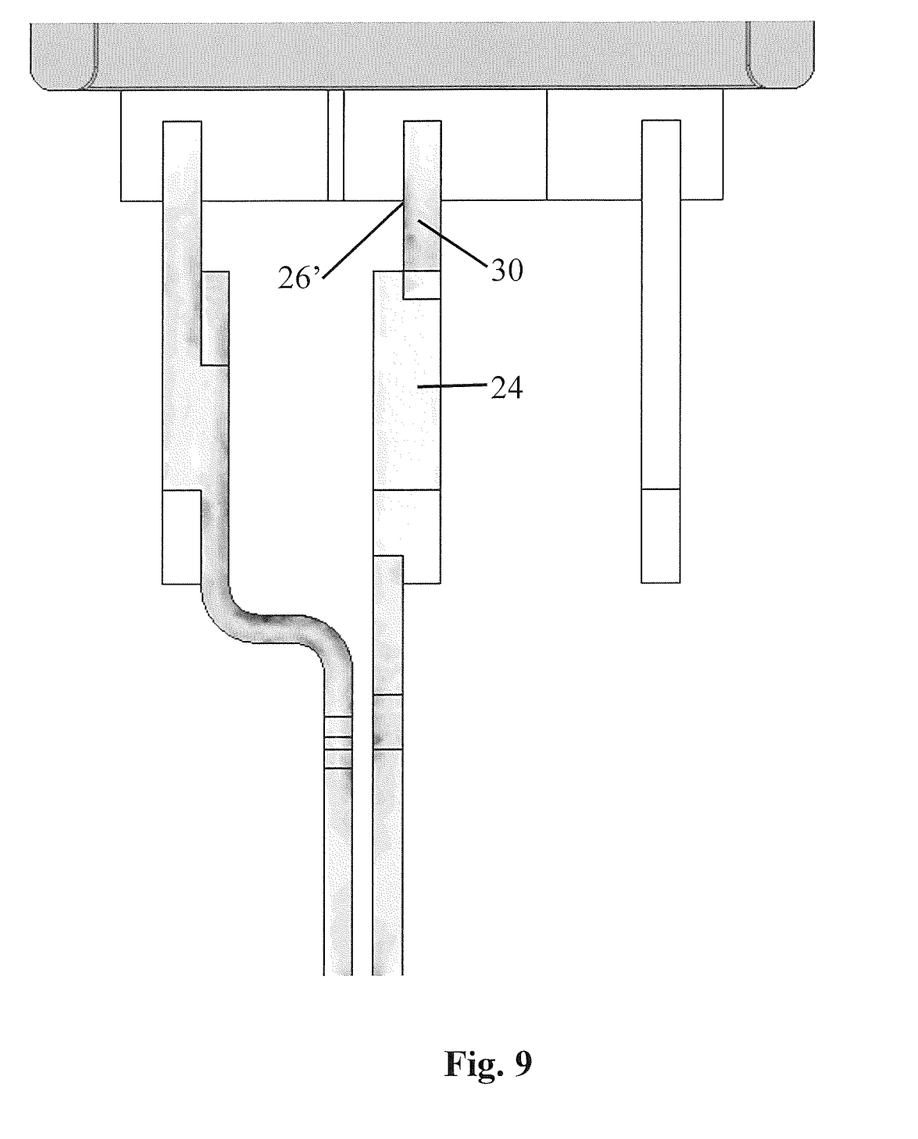
FIG. 9 illustrates terminal and bus bar current density for the terminal lead illustrated in FIG. 4.

Using a 3D finite element method (FEM) electromagnetic simulator, the terminal leads 30 disclosed herein were compared with prior art terminal leads in an exemplary design. The exemplary design was a 7 kW rated planar transformer used in a switch mode power converter that produces 250 A of 28 VDC power. A switch frequency of 115 kHz was assumed. FIG. 8 shows the 3D model of the planar transformer implemented using the prior art terminal leads 40. FIG. 9 shows the 3D model of a planar transformer of the same construction using the herein disclosed vertical terminals 30. In each case, bus bars 24 were added to the planar transformer electromagnetic model that carried the output power 1.5 inches beyond the terminals, which is a typical distance required for connection to rectifiers rated for 250 A of current.

Simulations of each planar transformer configuration were performed. The proximity effect along surface area face 26 of terminal lead 40 (FIG. 8) is much more pronounced than the proximity effect along the surface area face 26' of terminal lead 30 (FIG. 9). The results of the simulation are summarized in Table 1. The vertical terminal leads reduce the total losses by 55% over the prior art leads. In addition to higher termination loss, the prior art creates slightly more loss in the transformer windings due to increased current density within the transformer windings near the terminals. It should be noted that the termination loss of the prior art is higher than the winding conduction loss, which is not unusual for planar transformers operating with high current and frequency. FIG. 8 and FIG. 9 show the terminal and bus bar current densities of the prior art and the proposed solution, respectively. Because of proximity effects, the prior art design contains extremely high current density on the surfaces of the terminals and bus bars closest to each other. Current is much more evenly distributed within the terminals and bus bars of the proposed solution, leading to lower termination loss.

TABLE 1

| Configuration | Total Conduction Loss | Losses in Terminals | Losses in Bus bars | Transformer Winding Loss |
|---|---|---|---|---|
| T-Shaped Terminal (Prior Art) | 28.32 W | 4.89 W | 13.49 W | 9.94 W |
| Vertical Terminal (Invention) | 12.68 W | 1.34 W | 3.59 W | 7.75 W |

I claim:
1. A planar transformer comprising:
a magnetic core comprising an internal opening;
one or more primary planar windings arranged in a stack within the internal opening;

one or more secondary planar windings arranged in a stack within the internal opening, wherein each secondary planar winding is an open loop having a first end portion and a second end portion, each end portion disposed within or protruding in an outward direction from a front opening on a front of the magnetic core, and wherein at least one of the one or more primary planar windings and the secondary planar windings are high current capacity windings;

a first terminal electrically interconnected to at least one of the first end portions of the secondary planar windings;

a second terminal electrically interconnected to at least one of the second end portions of the secondary planar windings;

each of the first terminal and the second terminal having two elongated opposed largest surface area faces joined by a narrow width surface, an axis of the elongation being generally parallel to a plane of at least one of the planar secondary windings and extending in the outward direction from the stack of secondary planar windings;

the first and second terminals being further arranged to have at least one of their respective largest surface area faces generally facing and parallel to each other and not parallel to a plane of at least one of the primary planar windings and secondary planar windings.

2. The planar transformer of claim 1 wherein each first end portion has a notch dimensioned to receive an edge of said first terminal.

3. The planar transformer of claim 2 wherein each said first end portion is aligned to form a slot for receiving the edge of the first terminal.

4. The planar transformer of claim 3 wherein the slot includes a retention feature defined by the notches.

5. The planar transformer of claim 3 wherein the magnetic core has a rear opening disposed on a rear thereof.

6. The planar transformer of claim 5 wherein said first and second end portions are protruding from and extend beyond said front opening of the magnetic core.

7. The planar transformer of claim 1 wherein each first terminal has an edge with a notch dimensioned to receive an edge of said first end portion of said planar windings.

8. The planar transformer of claim 1 wherein each of the planar windings includes a sheet of metal.

9. The planar transformer of claim 8 wherein the primary and secondary planar windings and the first terminal lead are formed from copper or a copper-base alloy.

10. The planar transformer of claim 9 wherein the thickness of the first terminal is greater than the thickness of the high current capacity windings.

11. The planar transformer of claim 10 wherein the thickness of the first terminal is from 2 to 100 times the maximum thickness of the high current capacity windings.

12. The planar transformer of claim 1 wherein the high current capacity windings include a copper layer supported by a dielectric substrate.

13. The planar transformer of claim 12 wherein the copper layers supported by dielectric substrates are assembled into a printed circuit board.

14. The planar transformer of claim 13, wherein each first end portion has a notch dimensioned to receive an edge of said first terminal, and wherein a slotted retention feature defined by the notches provides enhanced retention of the first terminal lead.

15. The planar transformer of claim 1 wherein the spacing between the faces of the adjacent first and second terminals is between 0.25 and 6 inches.

16. The planar transformer of claim 1, further comprising a third terminal,
wherein the first and second end portions each comprise a notch, wherein the secondary windings are arranged generally alternately such that the notches of the first and second end portions are arranged to form first, second, and third slots, the first, second, and third terminals each engaging with the respective first, second, and third slots,
wherein the third terminal has two elongated opposed largest surface area faces joined by a narrow width surface, an axis of the elongation being generally parallel to a plane of at least one of the planar secondary windings and extending in the outward direction from the stack of secondary planar windings;
the third terminal being further arranged to have at least one of its largest surface area faces generally facing and parallel to a largest surface area face of at least one of the first and second terminals.

17. A planar transformer comprising:
a magnetic core comprising an internal opening;
one or more primary planar windings arranged in a stack of paralleled planar windings with one or more secondary planar windings, the stack of paralleled planar windings disposed within the internal opening and the planar dimension of each of the windings together defining a plane of the windings, wherein each secondary planar winding is an open loop having adjacent first and second end portions, and
a first terminal electrically interconnected to one or more of the first end portions and a second terminal electrically interconnected to one or more of the second end portions, each of the first and second terminals extending substantially beyond a front of their respective first or second end portions, and substantially outwardly from a front of the magnetic core; and
each of the first and second terminals having a respective face with a largest surface area of the faces of each terminal, the first and second terminals being further arranged to have at least one of their respective largest surface area faces generally facing and parallel to each other, and not parallel to a plane of at least one of the primary planar windings and secondary planar windings.

18. The planar transformer of claim 17 wherein the high current capacity windings include a copper layer supported by a dielectric substrate.

19. The planar transformer of claim 18 wherein the copper layers supported by dielectric substrates are assembled into a printed circuit board.

20. A planar transformer comprising:
a magnetic core comprising an internal opening;
one or more primary planar windings arranged in a stack within the internal opening;
one or more secondary planar windings arranged in a stack within the internal opening, wherein each secondary planar winding is an open loop having a first end portion and a second end portion, each end portion disposed within or protruding in an outward direction from a front opening on a front of the magnetic core,
wherein the first and second end portions each comprise a notch, wherein the secondary windings are arranged generally alternately in the stack such that the notches of the first and second end portions are arranged to form first, second, and third slots, and wherein at least one of the one or more primary planar windings and the secondary planar windings are high current capacity windings;

a first terminal, a second terminal, and a third terminal electrically interconnected to the respective first, second, and third slots;

each of the first, second, and third terminals having two elongated opposed largest surface area faces joined by a narrow width surface, an axis of the elongation being generally parallel to a plane of at least one of the planar secondary windings and extending in the outward direction from the stack of secondary planar windings;

each of the first, second, and third terminals having a respective face with a largest surface area of the faces of each terminal, the first, second, and third terminals each being further arranged to have at least one of their respective largest surface area faces generally facing and parallel to each other.

\* \* \* \* \*